(12) United States Patent
Hatanaka et al.

(10) Patent No.: US 11,906,466 B2
(45) Date of Patent: Feb. 20, 2024

(54) MEASUREMENT METHOD AND MEASUREMENT SYSTEM

(71) Applicant: Tokyo Electron Limited, Tokyo (JP)

(72) Inventors: Takayuki Hatanaka, Miyagi (JP); Tong Wu, Miyagi (JP); Satoshi Nomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 434 days.

(21) Appl. No.: 17/176,426

(22) Filed: Feb. 16, 2021

(65) Prior Publication Data

US 2021/0262987 A1     Aug. 26, 2021

(30) Foreign Application Priority Data

Feb. 26, 2020   (JP) ................. 2020-030316

(51) Int. Cl.
| | | |
|---|---|---|
| G01K 11/26 | (2006.01) | |
| H01L 21/67 | (2006.01) | |
| G01K 1/024 | (2021.01) | |
| G01K 1/02 | (2021.01) | |
| G01N 29/02 | (2006.01) | |

(Continued)

(52) U.S. Cl.
CPC ............ *G01N 29/022* (2013.01); *G01B 5/30* (2013.01); *G01K 1/024* (2013.01); *G01K 1/026* (2013.01); *G01K 11/265* (2013.01); *G01N 29/12* (2013.01); *G01N 29/2462* (2013.01); *H01J 37/32917* (2013.01); *H01L 21/67069* (2013.01); *H01L 21/67248* (2013.01); *G01N 2291/2697* (2013.01); *H01J 37/32091* (2013.01); *H01J 37/32715* (2013.01); *H01J 2237/2007* (2013.01); *H01J 2237/24592* (2013.01); *H01J 2237/334* (2013.01)

(58) Field of Classification Search
CPC .. G01N 29/022; G01N 29/2462; G01K 1/026; G01K 1/024; G01K 11/265; H01J 37/32917; H01L 21/67248
USPC .......................................................... 73/579
See application file for complete search history.

(56) References Cited

U.S. PATENT DOCUMENTS 4,365,503 A * 12/1982 Ho ...................... G01F 25/11
                                                 73/1.22
9,601,397 B1 * 3/2017 Oh ........................ H01L 22/26
(Continued)

FOREIGN PATENT DOCUMENTS

JP          2013-527641        6/2013

*Primary Examiner* — Lisa M Caputo
*Assistant Examiner* — Rose M Miller
(74) *Attorney, Agent, or Firm* — IPUSA, PLLC

(57) ABSTRACT

A measurement method performed by a semiconductor manufacturing apparatus including a chamber is provided. In the measurement method, first measurement data including a signal of a resonance frequency of the chamber is acquired as reference data, in response to transmitting an electrical signal into the chamber while a jig capable of performing wireless communication is not placed in the chamber. Subsequently, second measurement data including the signal of the resonance frequency of the chamber and including a signal of a resonance frequency of a sensor installed in the jig is acquired, in response to transmitting an electrical signal into the chamber while the jig is placed in the chamber. By subtracting the reference data from the second measurement data, third measurement data is calculated.

6 Claims, 13 Drawing Sheets

(51) Int. Cl.
*G01N 29/12* (2006.01)
*G01N 29/24* (2006.01)
*G01B 5/30* (2006.01)
*H01J 37/32* (2006.01)

(56) References Cited

U.S. PATENT DOCUMENTS

2003/0084999 A1\* 5/2003 Parsons ............ H01J 37/32082
156/345.46
2019/0057887 A1 2/2019 Ballandras et al.

\* cited by examiner

FIG.11

|  | BEFORE NOISE REDUCTION | AFTER NOISE REDUCTION |
| --- | --- | --- |
|  | S/N | S/N |
| Antenna A | 4.2 | 9.5 |
| Antenna B | 3.6 | 4.4 |
| Antenna C | 3.9 | 6.8 |

MEASUREMENT METHOD AND MEASUREMENT SYSTEM

CROSS-REFERENCE TO RELATED APPLICATIONS

This patent application is based upon and claims priority to Japanese Patent Application No. 2020-030316 filed on Feb. 26, 2020, the entire contents of which are incorporated herein by reference.

TECHNICAL FIELD

The present disclosure relates to a processing method and a plasma processing apparatus.

BACKGROUND

For example, Patent Document 1 proposes a method and system for measuring background noise of an instrument.

For example, Patent Document 2 proposes a method and sensing system for sensing characteristics within a semiconductor manufacturing apparatus with multiple sensors. The sensing system includes multiple sensors, a reader, and a reader antenna to estimate physical characteristics based on the sensing results of the multiple sensors for signals output from the reader antenna via the reader.

RELATED ART DOCUMENTS

Patent Documents

[Patent Document 1] Japanese National Publication of International Patent Application No. 2013-527641
[Patent Document 2] United States Patent Application Publication No. 2019/0057887

SUMMARY

The present disclosure provides a technique for eliminating noise in semiconductor manufacturing apparatus and for accurately predicting physical properties in semiconductor manufacturing apparatus.

According to one aspect of the present disclosure, a measurement method performed by a semiconductor manufacturing apparatus including a chamber is provided. In the measurement method, first measurement data including a signal of a resonance frequency of the chamber is acquired as reference data, in response to transmitting an electrical signal into the chamber while a jig capable of performing wireless communication is not placed in the chamber. Subsequently, second measurement data including the signal of the resonance frequency of the chamber and including a signal of a resonance frequency of a sensor installed in the jig is acquired in response to transmitting an electrical signal into the chamber while the jig is placed in the chamber. By subtracting the reference data from the second measurement data, third measurement data is calculated.

BRIEF DESCRIPTION OF THE DRAWINGS

FIG. 11 is a diagram illustrating an example of an effect after the resonance noise elimination according to the practical example.

DETAILED DESCRIPTION OF EMBODIMENTS

Hereinafter, embodiments for carrying out the present disclosure will be described with reference to the drawings. In each of the drawings, the same reference symbols are assigned to the same components, and overlapping descriptions may be omitted.

[Jig]

First, a jig LW used in a measurement system according to the present embodiment will be described with reference to FIG. 1. Hereinafter, as an example of the jig LW according to the present embodiment, a surface acoustic wave (SAW) sensor will be described. In one embodiment, the jig LW as the SAW sensor functions as a temperature sensor for detecting a temperature. However, the jig LW according to the present embodiment is not limited to sensing temperature, but can sense physical characteristics within a chamber of a semiconductor manufacturing apparatus.

The jig LW as the SAW sensor employs, for example, a wafer-shaped silicon substrate 43 as a base, and multiple SAW sensors 40a to 40i (may also be referred to as "sensor devices") are installed on the silicon substrate 43. The multiple SAW sensors 40a to 40i are provided at approximately regular intervals. Hereinafter, the SAW sensors 40a to 40i are collectively referred to as SAW sensors 40. The SAW sensor 40 has a communication function that enables wireless communication with a reader antenna RA.

Figure 1:
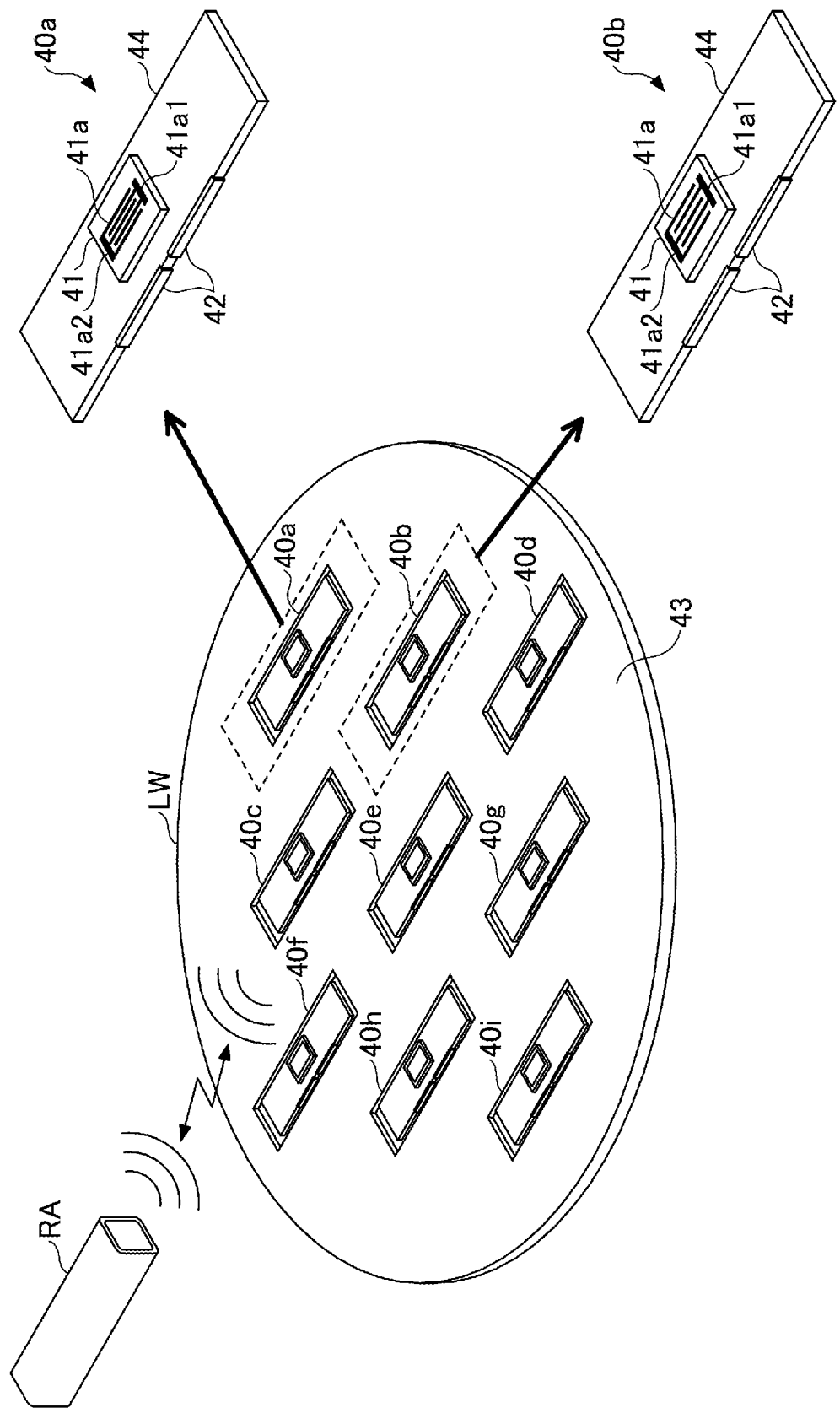
FIG. 1 is a view illustrating an example of a SAW sensor according to an embodiment.

In FIG. 1, the SAW sensor 40a and the SAW sensor 40b are each illustrated as an enlarged view. The SAW sensor 40a includes a SAW device 41 and a tag antenna 44. The SAW device 41 has an electrode 41a having, for example, a shape of comb, on a piezoelectric substrate. The electrode 41a includes an electrode 41a1 and an electrode 41a2 each made of a thin metal film and each being of a comb-shape. Teeth of the electrodes 41a1 and 41a2 are arranged such that the teeth of the electrode 41a1 are interlaced with the teeth of the electrode 41a2, thereby forming the comb-shaped electrode 41a. In other words, the teeth of the electrode 41a1 are inserted in gaps between teeth of the electrode 41a2, and the teeth of the electrode 41a2 are inserted in gaps between the teeth of the electrode 41a2. In the tag antenna 44, electrodes 42, which are electrically connected to the electrode 41a1 and the electrode 41a2 respectively, are provided.

From the electrodes 42, voltage is applied between the electrode 41a1 and the electrode 41a2. When an electrical signal transmitted from the reader antenna RA is input, crystalline particles (atoms) composing the SAW device 41 are subjected to stress due to piezoelectric effect of the piezoelectric substrate of the SAW device 41 on which the electrode 41a is formed, and the crystalline particles (atoms) are brought closer or farther away from each other due to the stress. This causes the surface of the SAW sensor 40 to vibrate in a wavy manner.

In each of the SAW sensors 40, the distance between the electrode 41a1 and the electrode 41a2 differs. In other words, the SAW sensors 40a and 40b have the same configuration with respect to the SAW device 41 and the tag antenna 44, but the distance between the electrodes 41a1 and 41a2 in the SAW sensor 40a differs from that in the SAW sensor 40b. By such a configuration, in each of the SAW sensors 40, among electrical signals input to the electrode 41a, an electrical signal of a frequency, which is unique to a corresponding SAW sensor 40 of the SAW sensors 40 and which is determined in accordance with the distance between the electrodes 41a1 and 41a2 in the corresponding SAW sensor 40, is increased in amplitude due to resonance, and the electrical signal whose amplitude is increased due to resonance is transmitted to the outside.

The reader antenna RA transmits electrical signals in a predetermined frequency band, and receives, in response to the transmitted electrical signals, electrical signals of a desired frequency selectively retrieved by the respective SAW sensors 40a to 40i. The measurement system according to the present embodiment estimates a temperature based on a change in frequency of the electrical signal output from each of the SAW sensors 40a to 40i. Also, because the resonance frequencies assigned to the respective SAW sensors 40a to 40i differ from each other, based on the resonance frequencies Included in the electrical signals output by the respective SAW sensors 40a to 40i, the measurement system can determine a location at which the measurement system has estimated a temperature, from among locations of the respective SAW sensors 40a to 40i. Accordingly, by using the jig LW as the SAW sensor, temperature at locations of the respective SAW sensors 40a to 40i can be estimated.

[Measurement System]

Figure 2:
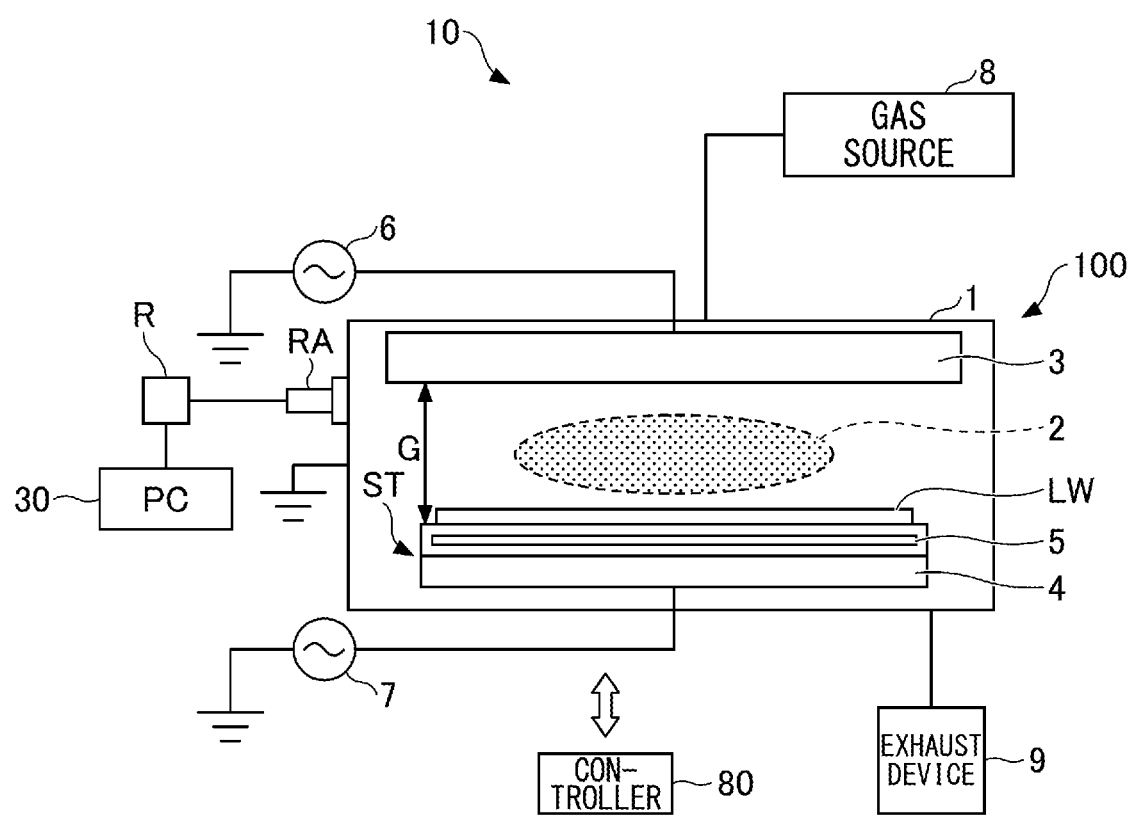
FIG. 2 is a diagram illustrating an example of a measurement system according to the embodiment.

The configuration of the measurement system 10 according to the present embodiment will be described with reference to FIG. 2. FIG. 2 is a diagram illustrating an example of the measurement system 10 according to the present embodiment. The measurement system 10 includes a semiconductor manufacturing apparatus 100, the reader antenna RA, a reader R, a personal computer (PC) 30 and the jig LW.

The semiconductor manufacturing apparatus 100 applies a desired process to a substrate, for example, a wafer. The semiconductor manufacturing apparatus 100 includes a chamber 1, and provides an example of plasma generating systems used to excite a plasma from a process gas within the chamber 1. FIG. 2 illustrates a capacitively coupled plasma (CCP) device, and a plasma 2 is formed between an upper electrode 3 and a stage ST. The stage ST also functions as a lower electrode. The stage ST includes a base 4 and an electrostatic chuck 5. During processing, a wafer is held on the stage ST. A radio-frequency (RF) source 6 and a radio-frequency (RF) source 7 are coupled to the upper electrode 3 and the stage ST respectively, and each of the RF source 6 and the RF source 7 outputs RF electric power. The frequency of electric power output from the RF source 6 may differ from that output from the RF source 7. In another embodiment, the RF source 6 and the RF source 7 may be coupled to the same electrode. In addition, a direct-current (DC) power supply may also be coupled to the upper electrode 3. A gas source 8 is connected to the chamber 1 to supply a process gas. An exhaust device 9 is connected to the chamber 1 to evacuate the interior of the chamber 1. The semiconductor manufacturing apparatus 100 includes a controller 80 that includes a processor and a memory, and the controller 80 controls each element of the semiconductor manufacturing apparatus 100 to apply plasma processing to a wafer.

The reader antenna RA is attached to a window that is provided at the side wall of the chamber 1 and that is formed of a dielectric such as quartz. The PC 30 is connected to the reader antenna RA via the reader R. The PC 30 is a computer that calculates the temperature detected by the SAW devices 41, based on signals outputted from the SAW sensors 40a to 40i and received by the reader antenna RA during measurement. The PC 30 is an example of an information processing apparatus, and the information processing apparatus is not limited to the PC 30. The information processing apparatus may be various types of electronic devices, such as a tablet terminal, a mobile terminal, or a wearable device.

The size of the jig LW is substantially the same as the size of a wafer, and is configured to be able to be transported by a conveying device. The jig LW is configured to wirelessly communicate with the reader antenna RA attached to the side wall of the chamber 1, without the need for a battery and a power supply. The jig LW having such a function can be transported into the chamber 1 using a transport arm of the conveying device, while maintaining a vacuum in the chamber 1. This reduces downtime of the semiconductor manufacturing apparatus 100. The jig LW is placed on the stage ST, and is used to measure the temperature.

When a temperature is to be measured using the jig LW, an unintentional resonant wave (a wave resonated at the resonance frequency of the chamber 1) may be generated due to the structure of the chamber 1 and due to influence of parts in the chamber 1, in response to electrical signals transmitted from the reader antenna RA into the chamber 1. Hereinafter, this resonant wave may also be referred to as a "resonance noise". In a case in which the jig LW as the SAW sensor is used while a resonance noise is generated, it is difficult to measure the temperature at accuracy required by a user, due to the resonance noise. The resonance noise also varies depending on the size of a gap G between the upper electrode 3 and the base 4, which is illustrated in FIG. 2. The resonance noise may also vary depending on the structure and assembly accuracy of parts provided in the chamber 1, and may also vary depending on the state of use of the chamber 1.

In the technical field of the semiconductor manufacturing apparatus 100, the tolerable range of the error in the measured temperature is approximately between 0.1° C. and 0.2° C. Thus, a resonance noise in the semiconductor manufacturing apparatus 100 may cause an unacceptable error in the measured temperature.

Accordingly, a measurement method performed in the measurement system 10 according to the embodiment to be described below eliminates the effect of a resonance noise, to measure a temperature at accuracy required in the semiconductor manufacturing apparatus 100. This allows accurate estimation of physical characteristics within the semiconductor manufacturing apparatus 100, such as a temperature of the stage ST.

[Measurement Method]

Figure 3A:
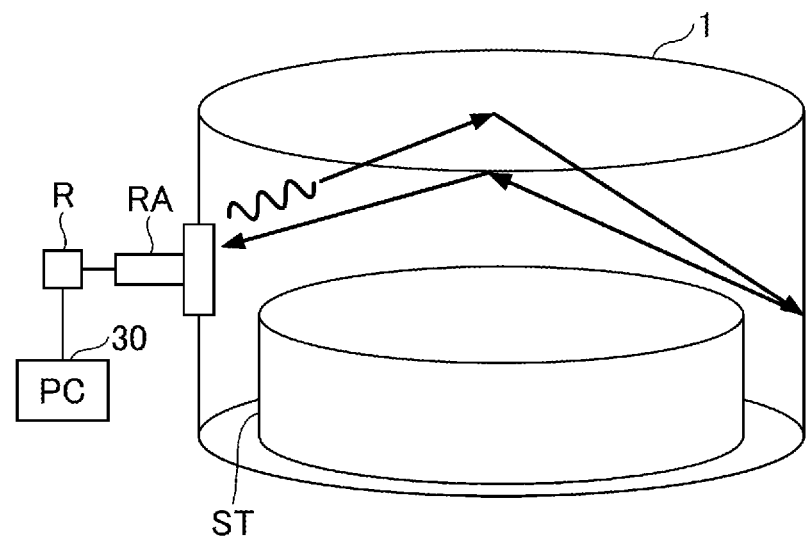
FIGS. 3A and 3B are diagrams illustrating an outline of a measurement method according to the embodiment.
Figure 3B:
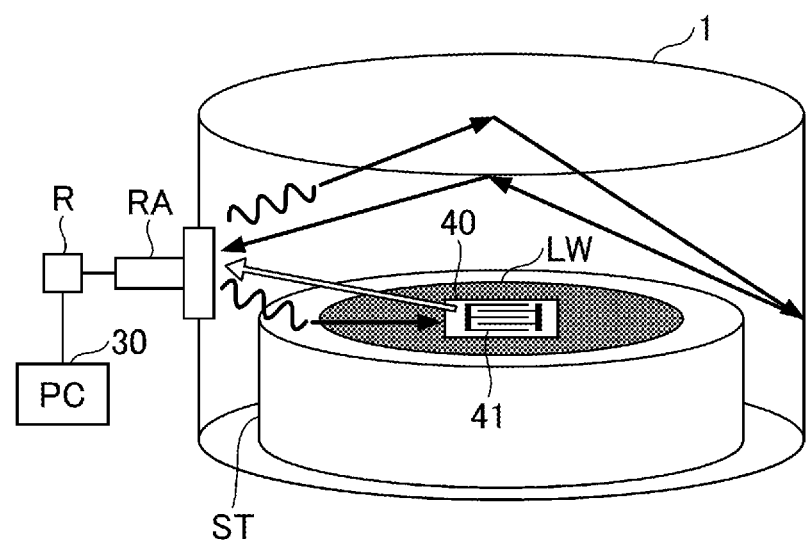
Figure 4:
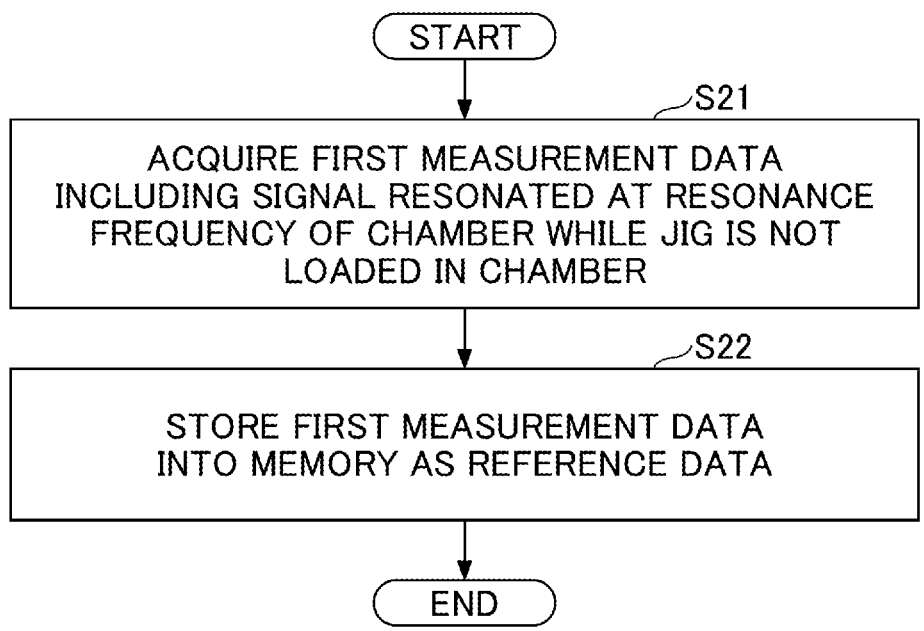
FIG. 4 is a flowchart illustrating an example of a process of measuring a resonance noise that is performed in the measurement method according to the embodiment.
Figure 5A:
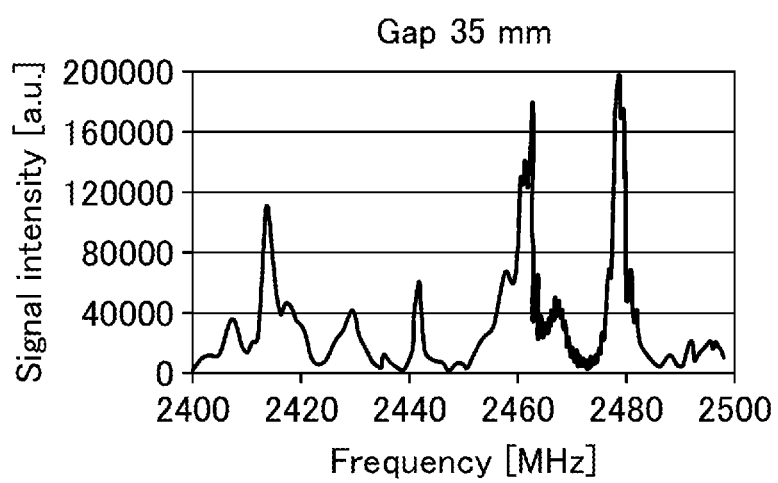
FIGS. 5A to 5C are diagrams illustrating examples of a resonance noise occurring in a chamber according to the embodiment.
Figure 5B:
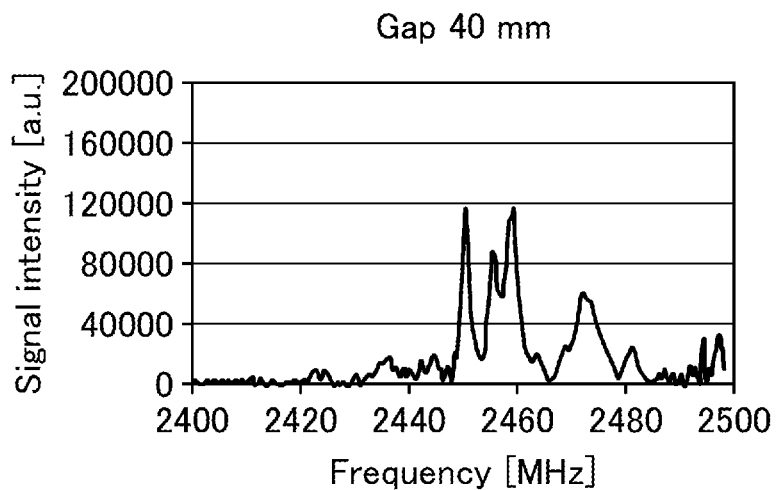
Figure 5C:
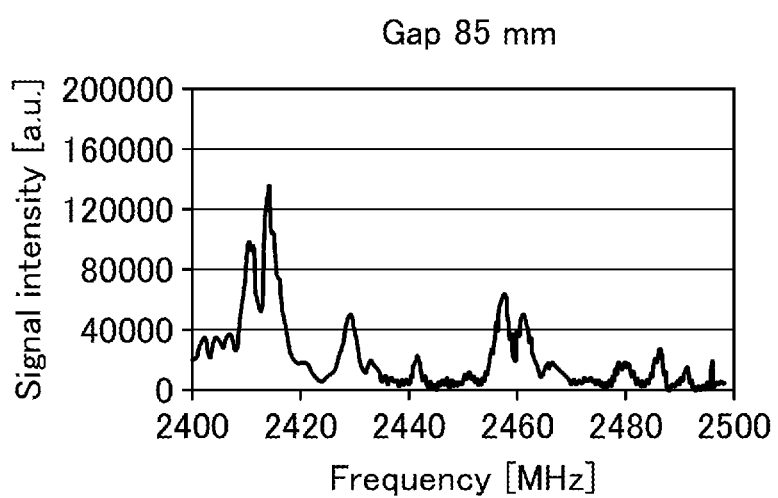
Figure 6:
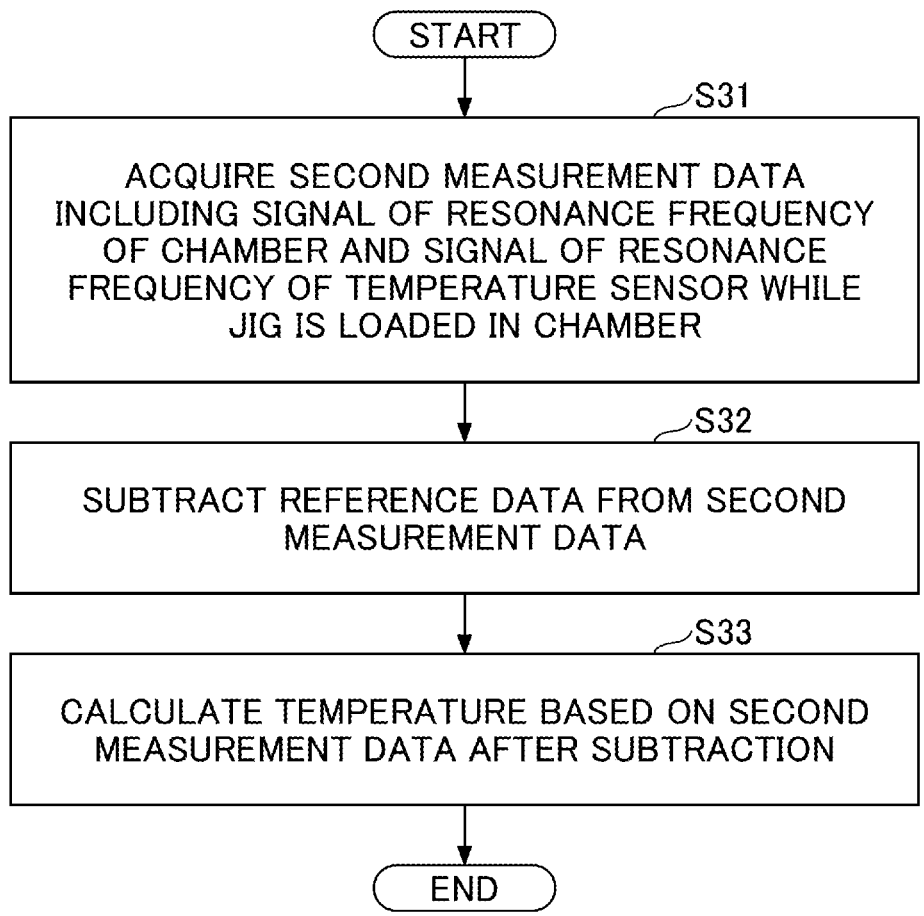
FIG. 6 is a flowchart illustrating an example of a process of measuring a temperature that is performed in the measurement method according to the embodiment.

Hereinafter, the measurement method according to the present embodiment will be described with reference to FIGS. 3A to 6. FIGS. 3A and 3B are diagrams illustrating an outline of the measurement method according to the present embodiment. FIG. 4 is a flowchart illustrating an example of a process of measuring a resonance noise performed by the PC 30, which is performed in the measurement method according to the present embodiment. FIGS. 5A to 5C are diagrams each illustrating an example of a resonance noise occurring in the chamber according to the present embodiment. FIG. 6 is a flowchart illustrating an example of a process of measuring a temperature performed by the PC 30, which is performed in the measurement method according to the present embodiment.

In the measurement method according to the present embodiment, measurement is performed both in a state in which the jig LW is not disposed on the stage ST in the chamber 1 as illustrated in FIG. 2 as an example, and in a state in which the jig LW is disposed on the stage ST in the chamber 1 as illustrated in FIG. 2. The reader antenna RA outputs electrical signals in a predetermined frequency band.

(First Step)

In the first step of the measurement method according to the present embodiment, electrical signals are emitted from the reader antenna RA into the chamber 1 without disposing the jig LW in the chamber 1, as illustrated in FIG. 3A. In response to input of the emitted electrical signals, resonance of a particular frequency (i.e., resonant wave) occurs in the chamber 1, depending on the structure of the chamber 1 and arrangement of parts in the chamber 1. Reflected signals containing the resonant wave are received by the reader antenna RA.

In step S21 of FIG. 4, the PC 30 acquires data of signals received by the reader antenna RA without placing the jig LW in the chamber 1. This data of the signals received from the reader antenna RA in step S21 is referred to as "first measurement data". The first measurement data includes a signal of a specific resonance frequency resonated in the chamber 1. Thus, the first measurement data indicates a resonance noise. In step S22 of FIG. 4, the PC 30 stores the first measurement data as reference data in the memory of the PC 30.

Examples of the first measurement data are illustrated in FIGS. 5A to 5C. FIGS. 5A to 5C are diagrams each illustrating an example of a resonance noise in the chamber 1 according to the present embodiment. The horizontal axis of the graph in FIGS. 5A to 5C indicates a frequency, and the vertical axis indicates signal intensity. That is, FIGS. 5A to 5C indicate spectra of the signals received by the reader antenna RA, and one or more peaks in the spectra indicate resonance frequencies. FIG. 5A illustrates an example of a spectrum, which indicates the signal intensity for each frequency component included in the resonance noise obtained when the gap G is 35 mm. FIG. 5B illustrates an example of a spectrum, which indicates the signal intensity for each frequency component included in the resonance noise obtained when the gap G is 40 mm. FIG. 5C illustrates an example of a spectrum, which indicates the signal intensity for each frequency component included in the resonance noise obtained when the gap G is 85 mm.

As described, the resonance frequency and signal intensity of the resonance frequency included in a resonance noise varies depending on the size of the gap G between the upper electrode 3 and the base 4. In addition, a resonance noise may vary depending on the structure and assembly accuracy of parts disposed in the chamber 1, or depending on the state of use of the chamber 1.

(Second Step)

In the second step of the measurement method according to the present embodiment, as illustrated in FIG. 35, electrical signals are transmitted from the reader antenna RA into the chamber 1 while the jig LW is placed on the stage ST in the chamber 1. Among the transmitted electrical signals, the reader antenna RA receives an electrical signal reflected in the chamber 1 and electrical signals of resonance frequencies of the respective SAW devices 41 of the respective SAW sensors 40 (only a single SAW sensor is illustrated in FIG. 3B) mounted on the jig LW. As will be described below, each of the SAW devices 41 has its unique resonance frequency.

In step S31 of FIG. 6, the PC 30 acquires data of signals received by the reader antenna RA while the jig LW is placed in the chamber 1. This data of the signals received from the reader antenna RA in step S31 is referred to as "second measurement data". The second measurement data includes the signal of the resonance frequency of the chamber 1 and signals of resonance frequencies that are detected by the respective SAW devices 41.

(Third Step)

Next, in the third step of the measurement method according to the present embodiment, in step S32 of FIG. 6, the PC 30 subtracts the reference data from the acquired second measurement data, to eliminate the resonance noise from the second measurement data. In step S33, the PC 30 calculates (estimates) the temperatures at respective locations of the SAW devices 41, based on the data obtained in step S32 by subtracting the reference data from the second measurement data. In the following description, the data obtained by subtracting the reference data from the second measurement data (i.e., by eliminating the resonance noise from the second measurement data) in step S33 is referred to as "third measurement data". Note that the third measurement data may also be referred to as "second measurement data after the reference data is subtracted (or eliminated)" or "second measurement data after subtraction".

According to the above steps, the temperature is estimated based on the third measurement data obtained by eliminating, from the second measurement data, resonance noise caused by the structure of the chamber 1 and parts disposed in the chamber 1. This can improve accuracy of the temperature measured by the jig LW because influence of resonance of signals reflected by the inner wall of the chamber 1 is eliminated.

In particular, in processes such as etching performed by the semiconductor manufacturing apparatus 100, temperature distribution control on a wafer during the processes is very important, from the viewpoint of production stability and the like. For example, in recent years, a temperature sensor for etching is required to measure a negative temperature (i.e., temperature below 0° C.). Therefore, a wafer-type temperature sensor equipped with a battery cannot be used for measuring a negative temperature even if it has a wireless communication function. In contrast, it is advantageous to perform temperature measurement using the jig LW according to the present embodiment, which does not require to have a battery and can be applied to negative temperature measurement.

The first measurement data acquired in the first step may be measured for each semiconductor manufacturing apparatus 100, and the reference data may be generated for each of the semiconductor manufacturing apparatuses 100. In a case in which multiple semiconductor manufacturing apparatuses 100 having the same configuration and having the same gap G are present, single reference data that is common to these semiconductor manufacturing apparatuses 100 (having the same gap G) may be generated.

The timing of performing the first step may be the time when starting up the semiconductor manufacturing apparatus 100, the time just after parts in the chamber 1 are replaced, or after maintenance of the semiconductor manufacturing apparatus 100. The timing of performing the second step may be the time between processing of each of lots, or the time after maintenance. Alternatively, the timing of performing the second step may be periodic (e.g., once a day).

Figure 7:
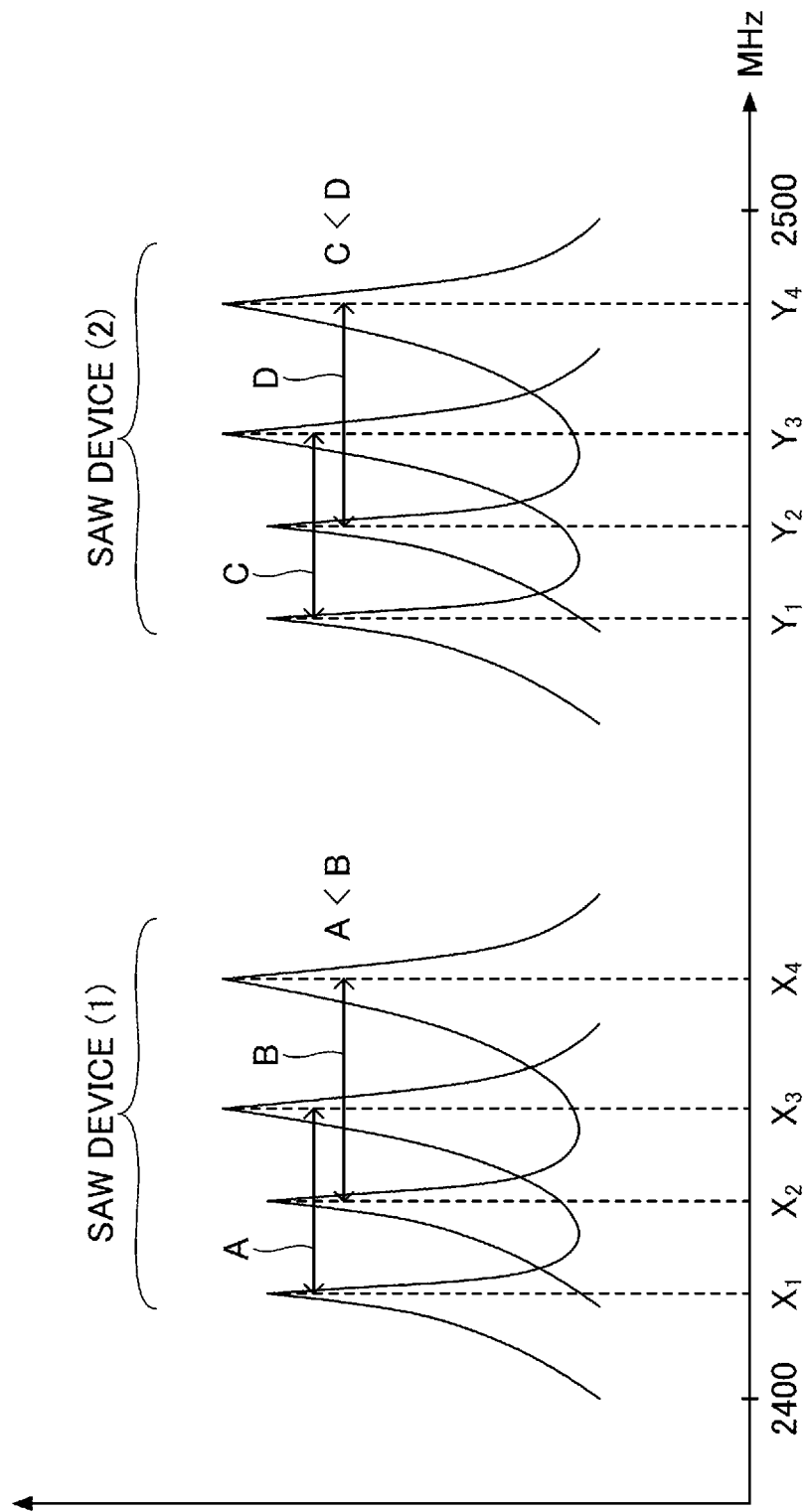
FIG. 7 is a diagram for explaining a temperature measurement principle according to the embodiment.

The PC 30 estimates the temperature based on the resonance frequency detected by each of the SAW devices 41. FIG. 7 is a diagram for explaining a principle of a temperature measurement method according to the present embodiment. For example, the SAW devices 41 mounted in the respective SAW sensors 40a and 40b are separately referred to as a SAW device 41(1) and a SAW device 41(2), respectively. In FIG. 7, the SAW device 41(1) is denoted by "SAW device (1)", and the SAW device 41(2) is denoted by "SAW device (2)". The resonance frequency sensed by the SAW device 41(1) is different from the resonance frequency sensed by the SAW device 41(2). For example, in a case in which the electrode 41a of the SAW device 41(1) resonates at frequencies X1 and X3, the PC 30 measures the temperature based on the width A between the two resonance frequencies (X1 and X3). Note that detection of resonance frequencies from the second measurement data is performed from the second measurement data after the reference data is subtracted (after resonance noise is eliminated). In a case in which the electrode 41a of the SAW device 41(1) resonates at frequencies X2 and X4, the PC 30 measures the temperature based on the width B (A<B) between the two resonance frequencies (X2 and X4). Similarly, the temperature of the SAW device 41(2) is calculated from the width C or D.

Thus, the SAW devices 41 mounted on the jig LW resonate at frequencies different from each other. Accordingly, in estimating temperatures, the PC 30 acquires the second measurement data containing signals of resonance frequencies sensed by the multiple SAW devices 41, subtracts the reference data from the second measurement data to obtain the third measurement data (second measurement data after subtraction), and estimates the temperatures based on the third measurement data. Also, based on a resonance frequency detected from the third measurement data, the PC 30 can identify the SAW device 41 that has transmitted the signal having the resonance frequency. Accordingly, when the PC 30 estimates a temperature based on a signal having a certain resonance frequency contained in the third measurement data, because the PC 30 can identify a SAW device 41 that has transmitted the signal of the certain resonance frequency, the PC 30 can identify the location on the stage ST corresponding to the estimated temperature based on the location of the identified SAW device 41.

Practical Example

Figure 8:
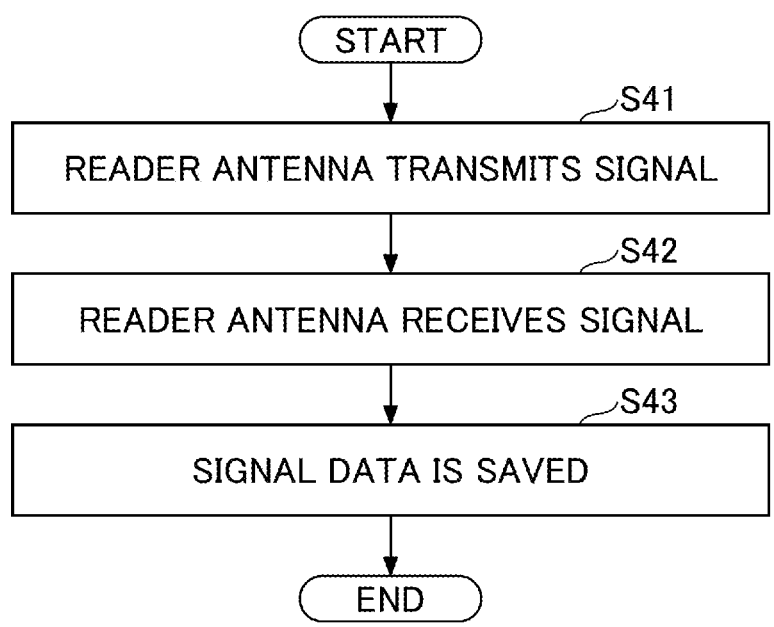
FIG. 8 is a flowchart illustrating an example of a process of measuring a resonance noise that is performed in the measurement method according to a practical example.
Figure 9:
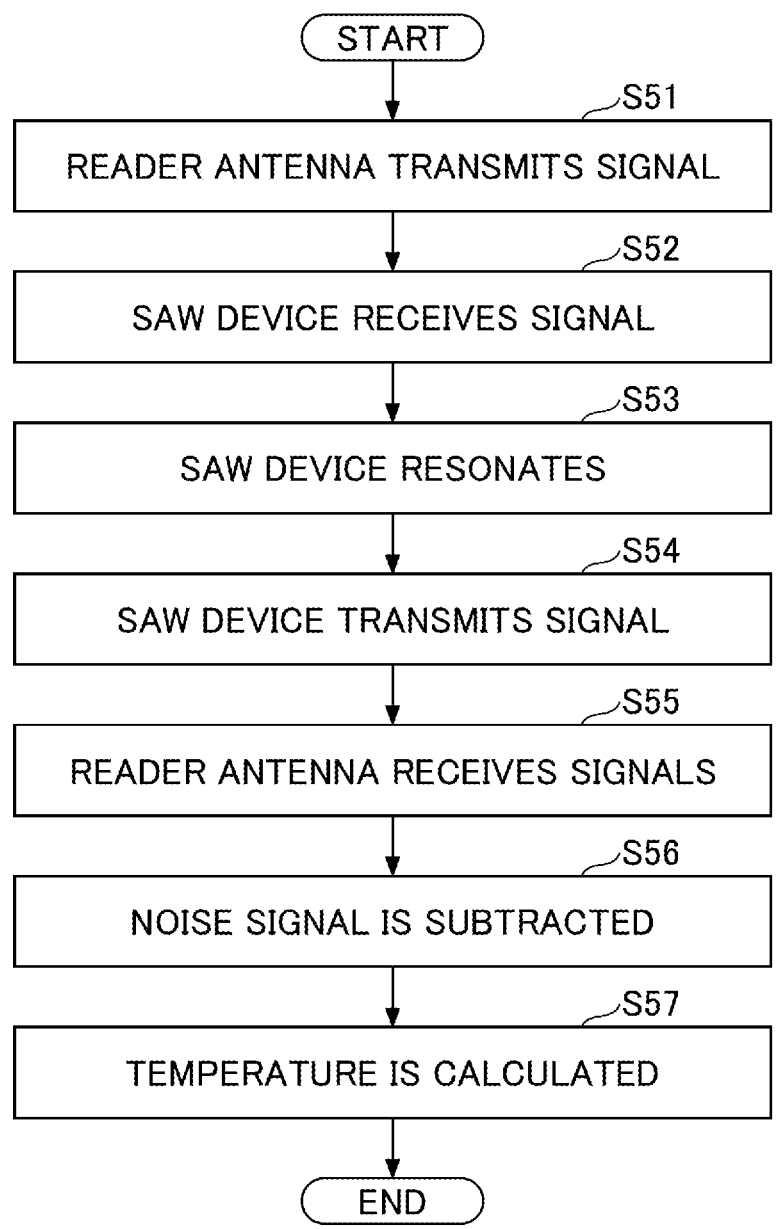
FIG. 9 is a flowchart illustrating an example of a process of measuring a temperature that is performed in the measurement method according to the practical example.

A practical example of the measurement method according to the above-described embodiment will be described with reference to FIGS. 8 and 9. FIG. 8 is a flowchart illustrating an example of measuring a resonance noise in the measurement method according to the practical example. FIG. 9 is a flowchart illustrating an example of temperature measurement in the measurement method according to the practical example.

In a process of measuring resonance noise illustrated in FIG. 8, first, the reader antenna RA transmits an electrical signal into the chamber 1 (step S41). At this point, the jig LW is not placed on the stage ST. Next, the reader antenna RA receives an electrical signal reflected in the chamber 1 (step S42).

Next, from the electrical signal received by the reader antenna RA, the PC 30 acquires the first measurement data including a resonance frequency of the chamber 1 (i.e., the first measurement data including a signal resonated at a resonance frequency of the chamber 1), stores the acquired first measurement data into the memory of the PC 30 as reference data (step S43), and the PC 30 terminates the process. This creates the reference data indicating the resonance noise.

In a process of the temperature measurement illustrated in FIG. 9, the reader antenna RA first transmits an electrical signal into the chamber 1 (step S51). At this point, the jig LW is placed on the stage ST. The respective SAW devices 41 mounted on the SAW sensors 40a to 40i receive the electrical signal from the reader antenna RA (step S52). Next, the SAW devices 41 each resonate at frequencies different from each other (step S53), and transmit respective electrical signals each including a resonance frequency of the corresponding SAW device 41 (step S54).

Next, the reader antenna RA receives electrical signals that include electrical signals transmitted from the respective SAW devices 41 and that include a reflected signal containing a resonant signal resonated in the chamber 1 (step S55). Next, the PC 30 acquires the second measurement data from the electrical signals received by the reader antenna RA, and calculates third measurement data by subtracting the reference data from the acquired second measurement data (step S56). Based on the third measurement data, the PC 30 calculates temperatures (step S57). After step S57 is performed, the PC 30 terminates the present process. By performing the above-described process, temperatures can be accurately calculated from the third data (i.e., the second measurement data from which resonance noise is eliminated).

[Effect]

Figure 10A:
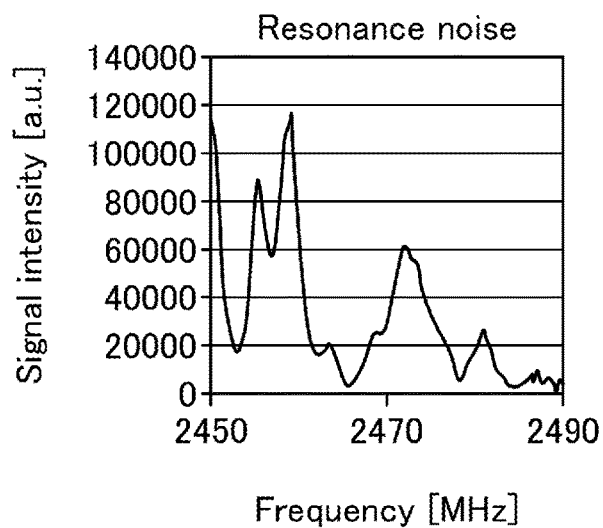
FIGS. 10A to 10D are graphs illustrating examples of effects of resonance noise elimination according to the practical example.
Figure 10B:
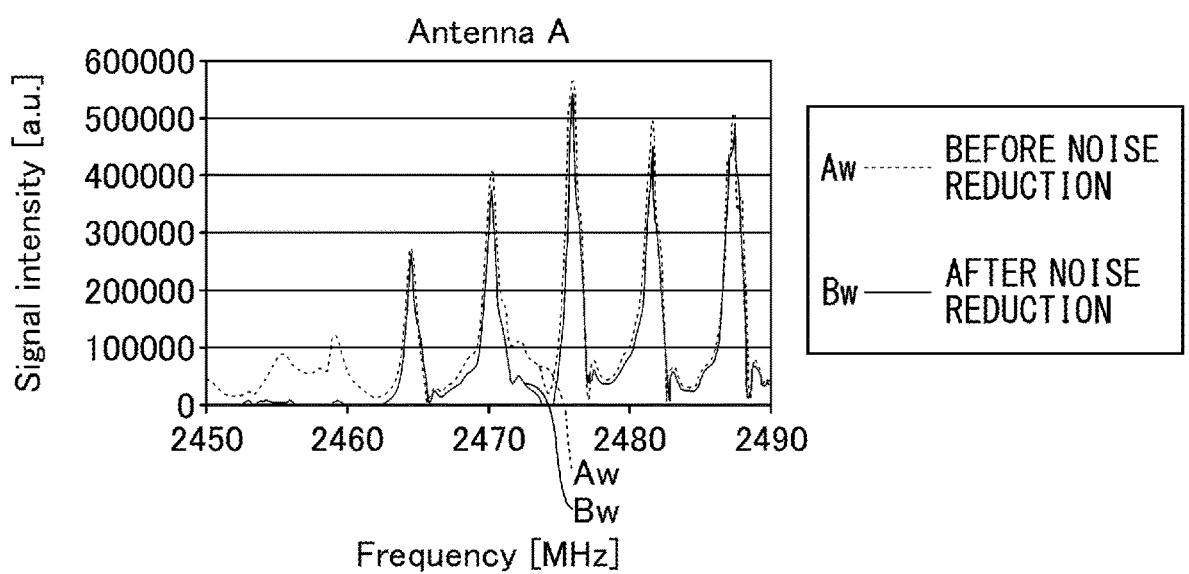
Figure 10C:
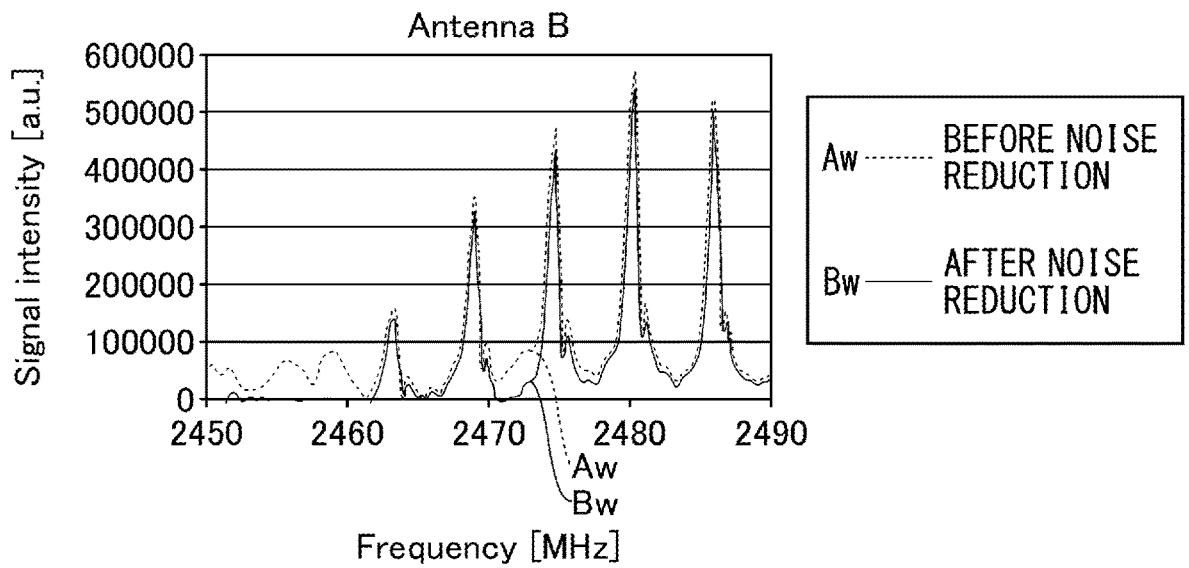
Figure 10D:
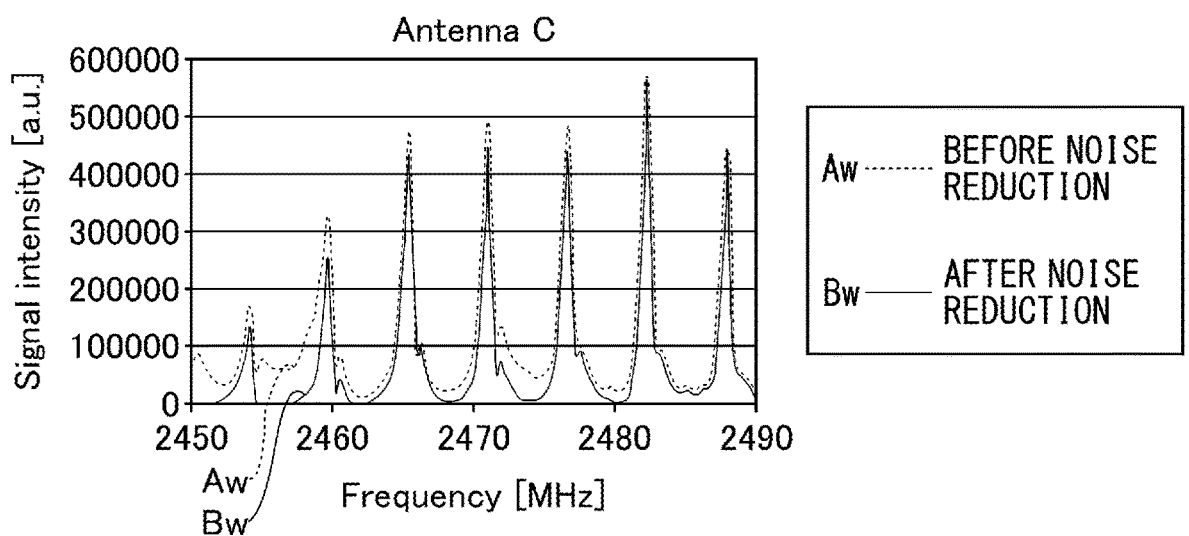

Results of eliminating resonance noise (reference data) from the second measurement data by performing the process according to the above-described practical example are illustrated in FIGS. 10B to 10D. Note that FIG. 10A is a graph illustrating an example of a spectrum of a signal of a resonance noise.

FIGS. 10B through 10D each illustrate a spectrum of electrical signals that contain an electrical signal received from a different SAW device 41 mounted on a corresponding tag antenna and an electrical signal reflected from the chamber 1. FIG. 10B illustrates a spectrum of electrical signals received from a first SAW sensor 40 (may also be referred to as "Antenna A"), FIG. 10O illustrates a spectrum of electrical signals received from a second SAW sensor 40 (may also be referred to as "Antenna B"), and FIG. 10D illustrates a spectrum of electrical signals received from a third SAW sensor 40 (may also be referred to as "Antenna C"). In the graphs of FIGS. 10B through 10D, a waveform Aw indicated by a dotted line represents a spectrum of the second measurement data before a resonance noise is subtracted, and a waveform Bw indicated by a solid line represents a spectrum of the second measurement data after a resonance noise is subtracted (i.e., spectrum of the third measurement data).

According to these results, for example, as illustrated in FIGS. 10B to 10D, in the waveform Bw representing the spectrum of the second measurement data after a resonance noise is subtracted, noise components near resonance frequencies (i.e., in the vicinity of peaks of the waveforms) were reduced as compared to the waveform Aw, which represents the spectrum of the second measurement data before a resonance noise is subtracted. From the above, it was found that the second measurement data, in which a resonance noise contained in the data (waveform Aw) before removing a resonance noise is removed, was obtained. From these results, by calculating the temperature using the second measurement data after a resonance noise is subtracted (waveform Bw), the temperature can be accurately measured because the resonance noise component is not contained.

FIG. 11 illustrates signal-to-noise ratios (S/N ratios) of electrical signals received from the Antennas A, B, and C before a resonance noise is eliminated and after resonance noise is eliminated, illustrated in FIGS. 10B to 10D. According to this, in all the electrical signals received from the Antennas A, B, and C, the S/N ratio after a resonance noise is eliminated was higher than the S/N ratio before a resonance noise is eliminated, and noise components in the received signals were reduced.

[Variation]

Figure 12:
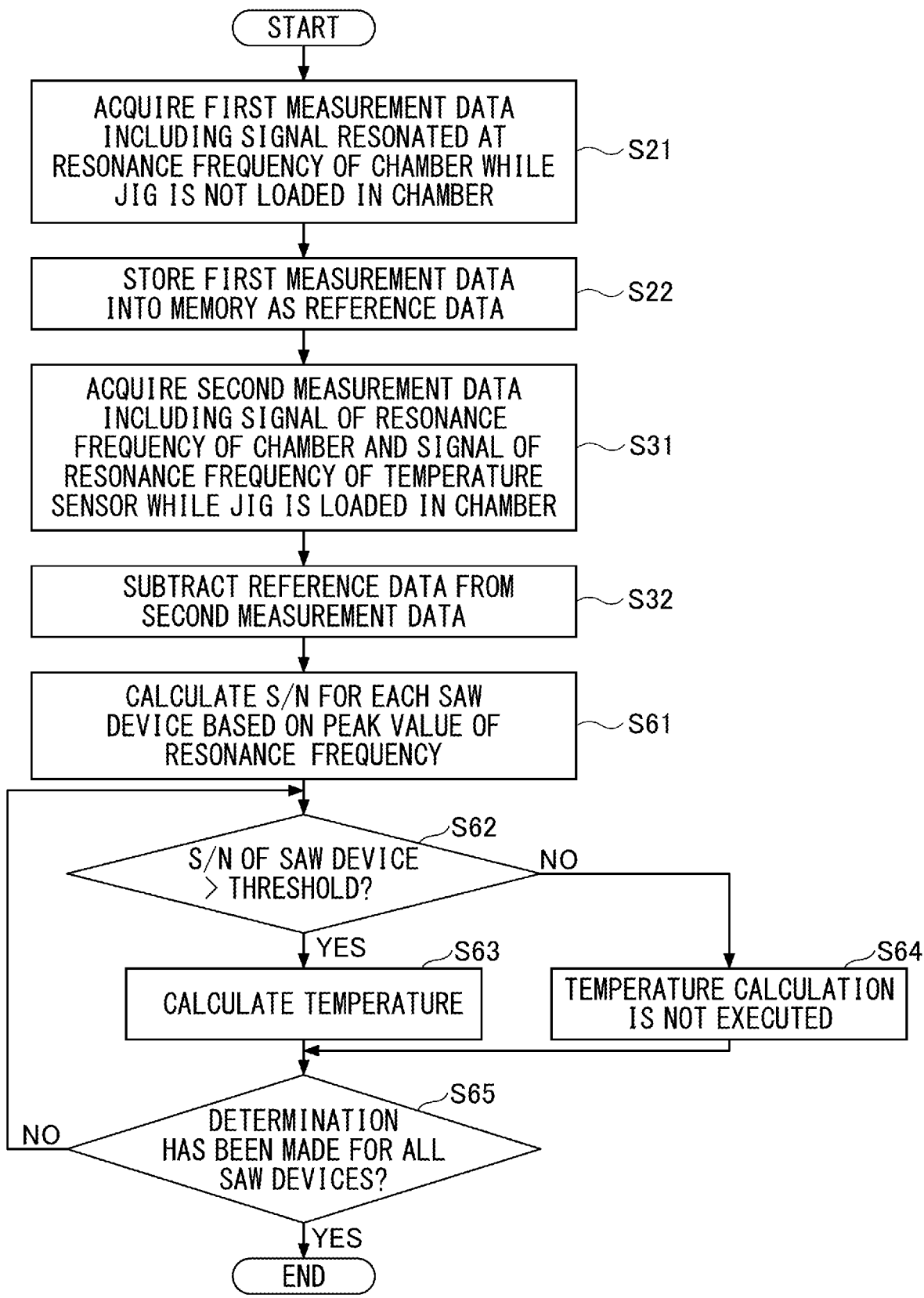
FIG. 12 is a flowchart illustrating an example of a process of measuring a temperature that is performed in the measurement method according to a modified example.

Finally, a measuring method (temperature measurement) according to a modified example of the present embodiment will be described with reference to FIG. 12. FIG. 12 is a flowchart illustrating an example of the measurement method according to the modified example. In steps having the same step numbers as step numbers illustrated in FIG. 4 or 6, the same processes as those illustrated in FIG. 4 or 6 are performed. Descriptions of the same processes are omitted or simplified.

When the present process is started, by performing steps S21, S22, S31, and S32, the PC 30 calculates the third measurement data by subtracting the first measurement data (i.e., reference data) from the second measurement data, to remove resonance noise.

Next, in step S61, the PC 30 calculates a signal-to-noise ratio (S/N ratio) of each of the SAW devices 41, which indicates a ratio of intensity of a resonance frequency of a corresponding SAW device 41 to intensity of noise of an area in which the corresponding SAW device 41 is placed. Note that, in the present specification, the intensity of a resonance frequency may also be referred to as a "peak value of resonance frequency". Next, for each of the SAW devices 41, the PC 30 executes step S62 to step S65. Specifically, in step S62, the PC 30 determines whether the S/N ratio of the corresponding SAW device 41 is greater than a predetermined threshold (step S62).

If the PC 30 determines in step S62 that the S/N ratio of the corresponding SAW device 41 is greater than the predetermined threshold, the PC 30 calculates the temperature at a position of the corresponding SAW device 41 (step S63). Meanwhile, if it is determined in step S62 that the S/N ratio of the corresponding SAW device 41 is equal to or less than the predetermined threshold value, the PC 30 determines that noise of the area in which the corresponding SAW device 41 is placed cannot be completely removed, and the PC 30 does not calculate a temperature at the corresponding SAW device 41 (step S64). Next, in step S65, the PC 30 determines whether steps S62 to S64 have been performed for all of the SAW devices 41. If steps S62 to S64 have not been made for all of the SAW devices 41, the process returns to step S62, and the PC 30 repeats steps S62 to S65. If steps S62 to S64 have been performed for all of the SAW devices 41, the present process terminates.

For example, in the example of FIG. 11, if the threshold used in step S62 is "5", because the S/N ratio of the antenna A and the S/N ratio of the antenna C are greater than the threshold, it is determined that influence of noise is small with respect to the antenna A and the antenna C, and temperatures at the antennas A and C are calculated. Meanwhile, with respect to the antenna B, because the S/N ratio is smaller than the threshold, it is determined that influence of noise is large, and the temperature at the antenna B is not calculated. By performing the above-described process, accuracy of temperature measurement using the SAW device 41 can be increased.

As described above, according to the measurement method of the present embodiment, because resonance noise generated in the chamber 1 can be eliminated from measured data, a temperature on the mounting surface of the stage ST in the chamber 1 can be accurately estimated.

The measurement method and the measurement system according to the embodiments disclosed herein are to be considered to be examples in all respects and not restrictive. The above embodiments may be modified and enhanced in various forms without departing from the scope of the claims and spirit thereof. Matters described in the above embodiments may take other configurations to an extent not inconsistent, and may be combined to an extent not inconsistent.

For example, in the above-described embodiments, the temperature on the stage is described as an example of physical characteristics within the semiconductor manufacturing apparatus, but physical characteristics within the semiconductor manufacturing apparatus are not limited to the temperature. For example, as an example of the physical characteristics within the semiconductor manufacturing apparatus, environmental information within the chamber, such as wafer strain distribution, may be estimated.

The semiconductor manufacturing apparatus according to the present disclosure may be any types of plasma processing apparatuses, such as an apparatus for an atomic layer deposition (ALD), a capacitively coupled plasma (CCP) type apparatus, an inductively coupled plasma (ICP) type apparatus, a radial line slot antenna (RLSA) type apparatus, an electron cyclotron resonance plasma (ECR) type apparatus, and a helicon wave plasma (HWP) type apparatus.

Further, the semiconductor manufacturing apparatus may be a device in which a certain process, such as a film deposition process or an etching process is applied to a substrate.

What is claimed is:

1. A measurement method performed by an information processing apparatus in a semiconductor manufacturing apparatus including a chamber, the measurement method comprising:
   a) acquiring, as reference data, first measurement data received by a reader antenna, the first measurement data including a signal of a resonance frequency of a resonant wave generated in the chamber in response to an electromagnetic wave transmitted from the reader antenna to the chamber, while a jig capable of performing wireless communication is not placed in the chamber;
   b) acquiring second measurement data received by the reader antenna, the second measurement data including the signal of the resonance frequency of the resonant wave and including a signal of a resonance frequency of a sensor installed in the jig in response to the electromagnetic wave transmitted from the reader antenna to the chamber, while the jig is placed in the chamber;

c) calculating third measurement data by subtracting the reference data from the second measurement data acquired in b); and d) estimating physical characteristics in the chamber based on the third measurement data, wherein the jig is placed on a stage provided in the chamber; and
the physical characteristics include a temperature at the stage; and wherein the sensor is provided with a plurality of sensor devices, each of the plurality of sensor devices having a resonance frequency different from each other;
the second measurement data acquired in b) includes signals of the resonance frequencies of the plurality of sensor devices; and
a temperature at each of the plurality of sensor devices is estimated in d), based on the resonance frequencies of the plurality of sensor devices that are detected from the third measurement data calculated in c).

2. The measurement method according to claim 1, further comprising:

e) obtaining intensity of the signal of the resonance frequency of at least one sensor device of the plurality of sensor devices installed in the jig using the third measurement data calculated in c), f) obtaining intensity of noise using the first measurement data acquired in a), g) calculating a signal-to-noise (S/N) ratio that is a ratio of the intensity of the signal obtained in e) to the intensity of noise obtained in f);

h) determining whether the S/N ratio is greater than a predetermined threshold; and i) estimating a temperature based on the signal of the resonance frequency of the at least one sensor device, in response to the S/N ratio being greater than the predetermined threshold.

3. The measurement method according to claim 1, wherein the physical characteristics includes environmental information in the chamber.

4. A measurement system comprising:

a semiconductor manufacturing apparatus including a chamber;

a jig in which a sensor is installed, the sensor being provided with a plurality of sensor devices, each of the plurality of sensor devices having a resonance frequency different from each other and the jig being capable of performing wireless communication;

a reader antenna; and an information processing apparatus; wherein the measurement system is configured to perform processes of a) receiving, by the reader antenna, first measurement data including a signal of a resonance frequency of a resonant wave generated in the chamber in response to an electromagnetic wave transmitted from the reader antenna to the chamber while the jig is not placed in the chamber;

b) acquiring, by the information processing apparatus, the first measurement data received by the reader antenna as reference data;

c) receiving, by the reader antenna, second measurement data including the signal of the resonance frequency of the resonant wave and including a signal of a resonance frequency of the sensor installed in the jig in response to the electromagnetic wave transmitted from the reader antenna to the chamber; while the jig is placed in the chamber;

d) acquiring, by the information processing apparatus, the second measurement data received by the reader antenna; and e) subtracting, by the information processing apparatus, the reference data from the second measurement data acquired in d);

wherein the second measurement data acquired in c) includes signals of the resonance frequencies of the plurality of sensor devices; and a temperature at each of the plurality of sensor devices is estimated based on the resonance frequencies of the plurality of sensor devices.

5. The measurement system according to claim 4, wherein the jig is formed in a shape of a wafer.

6. The measurement system according to claim 4, wherein the jib includes a base formed of a silicon substrate; and the plurality of sensor devices are installed on the base.

* * * * *